(12) United States Patent
Oda et al.

(10) Patent No.: US 9,780,030 B2
(45) Date of Patent: Oct. 3, 2017

(54) INTEGRATED CIRCUIT

(71) Applicant: KABUSHIKI KAISHA TOSHIBA, Minato-ku (JP)

(72) Inventors: Masato Oda, Yokohama (JP); Mari Matsumoto, Kawasaki (JP); Kosuke Tatsumura, Yokohama (JP); Shinichi Yasuda, Setagaya (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/212,487

(22) Filed: Jul. 18, 2016

(65) Prior Publication Data

US 2017/0025353 A1    Jan. 26, 2017

(30) Foreign Application Priority Data

Jul. 21, 2015 (JP) .................................. 2015-144366

(51) Int. Cl.
| | |
|---|---|
| H03K 19/003 | (2006.01) |
| H03K 19/173 | (2006.01) |
| G11C 17/00 | (2006.01) |
| H01L 23/525 | (2006.01) |
| H03K 19/177 | (2006.01) |
| H01L 27/112 | (2006.01) |
| H03K 19/00 | (2006.01) |
| G11C 17/18 | (2006.01) |
| G11C 17/16 | (2006.01) |

(52) U.S. Cl.
CPC .... *H01L 23/5252* (2013.01); *H01L 27/11206* (2013.01); *H03K 19/0013* (2013.01); *H03K 19/00346* (2013.01); *H03K 19/1735* (2013.01); *H03K 19/1737* (2013.01); *H03K 19/1776* (2013.01); *H03K 19/17728* (2013.01); *G11C 17/16* (2013.01); *G11C 17/18* (2013.01)

(58) Field of Classification Search
CPC ............. H01L 23/5252; H01L 23/5256; H01L 23/528; H01L 27/11206; G11C 17/165; G11C 17/18; H03K 19/0013; H03K 19/00346; H03K 19/1735; H03K 19/1737; H03K 19/17728; H03K 19/1776
USPC ...................... 326/15, 14, 38; 365/96, 225.7
See application file for complete search history.

(56) References Cited

U.S. PATENT DOCUMENTS 4,758,745 A    7/1988 Elgamal et al.
5,200,652 A    4/1993 Lee
(Continued)

FOREIGN PATENT DOCUMENTS

JP    2007-194445 A    8/2007
JP    2014-143284 A    8/2014
(Continued)

*Primary Examiner* — Daniel D Chang
(74) *Attorney, Agent, or Firm* — Oblon, McClelland, Maier & Neustadt, L.L.P.

(57) ABSTRACT

An integrated circuit according to an embodiment includes: an anti-fuse element including a first terminal and a second terminal; a fuse element including a third terminal connected to the second terminal, and a fourth terminal; a first wiring line connected to the first terminal of the anti-fuse element; and a drive circuit configured to supply a plurality of potentials to the first terminal of the anti-fuse element, the drive circuit being connected to the first wiring line, the potentials being different from each other.

22 Claims, 13 Drawing Sheets

(56) References Cited

U.S. PATENT DOCUMENTS

| | | | |
|---|---|---|---|
| 5,412,593 A * | 5/1995 | Magel | G11C 17/16 365/225.7 |
| 7,715,219 B2 * | 5/2010 | Monreal | G11C 17/16 365/225.7 |
| 2008/0170457 A1 | 7/2008 | Kothandaraman | |
| 2009/0323450 A1 * | 12/2009 | Monreal | G11C 17/16 365/225.7 |
| 2014/0204649 A1 | 7/2014 | Kanda et al. | |
| 2015/0311900 A1 | 10/2015 | Yasuda et al. | |
| 2015/0348631 A1 | 12/2015 | Matsumoto et al. | |

FOREIGN PATENT DOCUMENTS

| | | |
|---|---|---|
| JP | 2015-211326 A | 11/2015 |
| JP | 2015-230919 A | 12/2015 |

* cited by examiner

US 9,780,030 B2

INTEGRATED CIRCUIT

CROSS REFERENCE TO RELATED APPLICATIONS

This application is based upon and claims the benefit of priority from prior Japanese Patent Application No. 2015-144366 filed on Jul. 21, 2015 in Japan, the entire contents of which are incorporated herein by reference.

FIELD

Embodiments described herein relate generally to integrated circuits.

BACKGROUND

A field programmable gate array (FPGA) is an integrated circuit that can achieve an appropriate logical function. An FPGA normally includes logical blocks that achieve basic logical information, and switch blocks that switch connections between the logical blocks. With these blocks, the FPGA can achieve a logical function desired by a user. The logical information about the logical blocks and the data of the switch blocks that switch the connections between the logical blocks are stored in respective configuration memories, and a desired logical function is achieved in accordance with the information and the data stored in the configuration memories.

In a conventional FPGA, a static random access memory (SRAM) is used as a configuration memory. The SRAM is formed with six to eight transistors, and occupies a large area in the chip.

It is known that a nonvolatile memory is used as a configuration memory. This nonvolatile memory includes an anti-fuse element as a memory element in the intersection region between first and second wiring lines. The anti-fuse element includes a first terminal connected to the first wiring line and a second terminal connected to the second wiring line. In an example of a switch circuit that is used as a switch block, a conventional FPGA that uses an SRAM includes one or more MOS (Metal-Oxide-Semiconductor) transistors having its output(s) connected to the SRAM serving as a configuration memory. In an FPGA that uses an anti-fuse element, on the other hand, the anti-fuse element functions as a switch that opens and closes data. Accordingly, the FPGA occupies a much smaller area than an SRAM.

However, in a case where such an anti-fuse memory is used, the standby energy increases due to leakage current from a peripheral circuit, and the power supply voltage drops. Further, the inverter connected to the output terminal of the memory is broken by the hot carriers or heat generated from the current.

DETAILED DESCRIPTION

An integrated circuit according to an embodiment includes: an anti-fuse element including a first terminal and a second terminal; a fuse element including a third terminal connected to the second terminal, and a fourth terminal; a first wiring line connected to the first terminal of the anti-fuse element; and a drive circuit configured to supply a plurality of potentials to the first terminal of the anti-fuse element, the drive circuit being connected to the first wiring line, the potentials being different from each other.

The background to the development of embodiments is explained below, before the embodiments are described.

Figure 1:
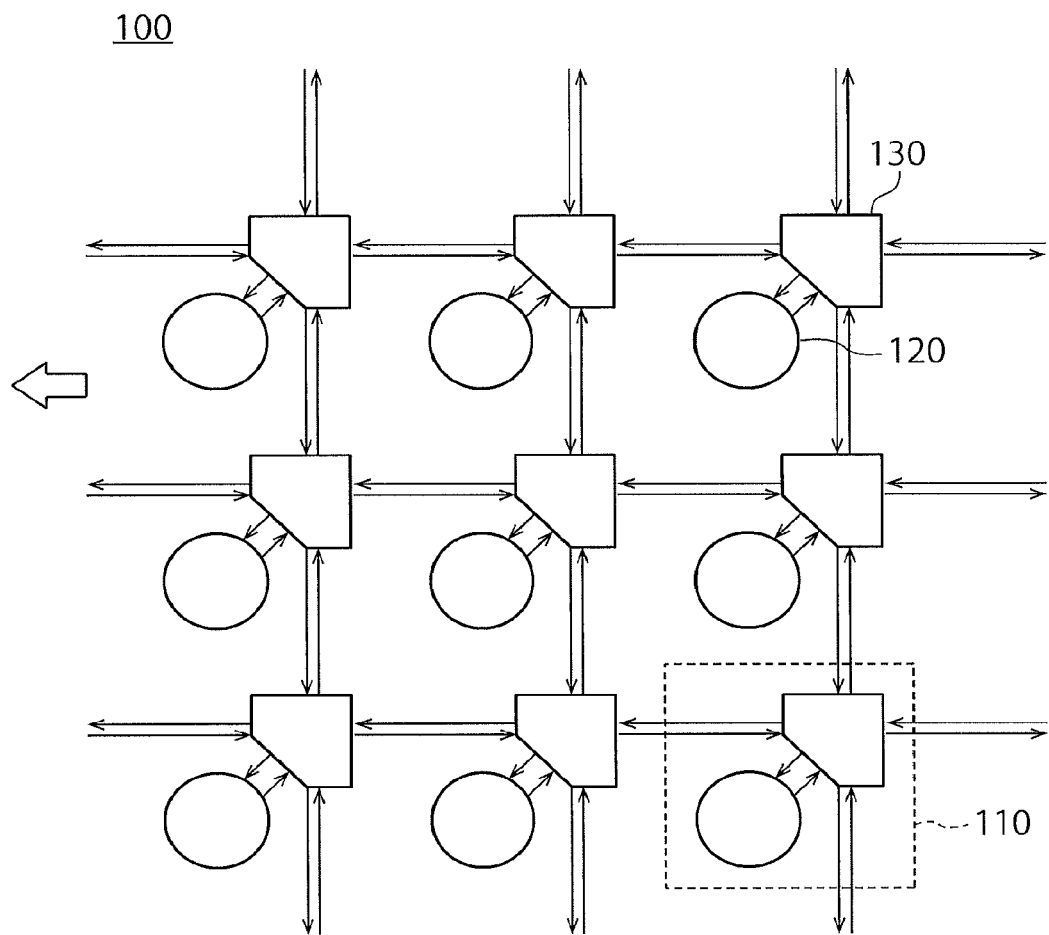
FIG. 1 is a block diagram showing the structure of an FPGA.

First, the structure of a conventional FPGA is described. As shown in FIG. 1, an FPGA 100 normally includes basic blocks 110 arranged in an array. Each basic block 110 is connected to adjacent basic blocks 110 by wiring lines. Each basic block 110 includes a logical block 120 and a switch block 130. The logical block 120 is a block that performs a logical operation, and its fundamental structure is formed with a look-up table including a table of truth table. Each switch block 130 controls connecting and disconnecting of the wiring lines to be connected to the adjacent basic blocks 110, to enable signal transmission in a desired direction.

Each switch block 130 also controls the connection to the logical block 120. The logical block 120 and the switch block 130 can perform connection control in accordance with the data stored in the respective configuration memories.

Figure 2:
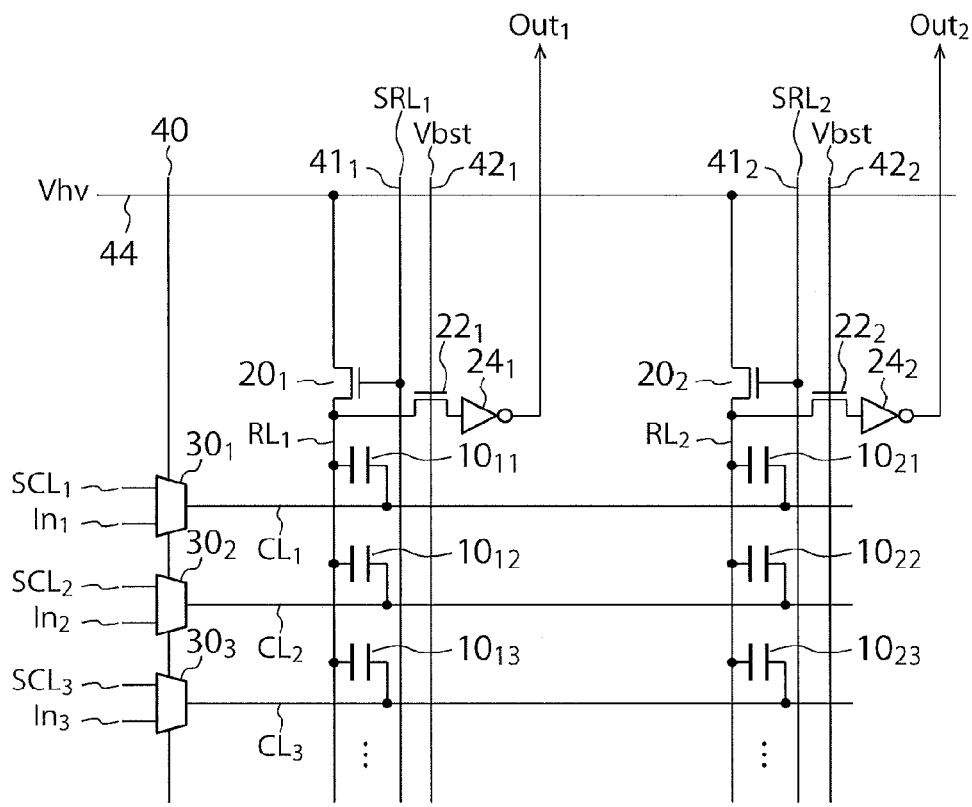
FIG. 2 is a diagram showing an example of a switch block using anti-fuse elements.

Referring now to FIG. 2, problems with a case where a nonvolatile memory is used as a configuration memory are described. This nonvolatile memory includes anti-fuse elements as memory elements in the intersection regions between first and second wiring lines. Each anti-fuse element includes a first terminal connected to the first wiring line and a second terminal connected to the second wiring line. FIG. 2 is a circuit diagram showing an example of a switch block 130 in which a nonvolatile memory is used as the configuration memory.

The switch block 130 shown in FIG. 2 includes: row wiring lines $RL_1$ and $RL_2$; column wiring lines $CL_1$, $CL_2$, and $CL_3$ intersecting with the row wiring lines $RL_1$ and $RL_2$; output lines $Out_1$ and $Out_2$ corresponding to the row wiring lines $RL_1$ and $RL_2$; anti-fuse elements $10_{ij}$ provided in the intersection regions between the row wiring lines $RL_i$ (i=1 and 2) and the column wiring lines $CL_j$ (j=1, 2, and 3); high-voltage select transistors $20_i$ that correspond to the respective row wiring lines $RL_i$ (i=1 and 2), each high-voltage select transistor $20_i$ having one of the source and the drain connected to a wiring line 44 and having the other one of the source and the drain connected to the corresponding row wiring line $RL_i$; cutoff transistors $22_i$ corresponding to the respective row wiring lines $RL_i$ (i=1 and 2); inverters $24_i$ provided between the cutoff transistors $22_i$ (i=1 and 2) and the output lines $Out_i$; and multiplexers $30_j$ corresponding to the respective column wiring lines $CL_j$ (j=1, 2, and 3).

Each anti-fuse element $10_{ij}$ (i=1 and 2, j=1, 2, and 3) has one terminal connected to the corresponding row wiring line $RL_i$, and has the other terminal connected to the corresponding column wiring line $CL_j$.

Each select transistor $20_i$ (i=1 and 2) has its gate connected to a control line $41_i$ that receives a row select signal $SRL_i$. Each cutoff transistor $22_i$ (i=1 and 2) has its gate connected to a control line $42_i$ that receives a signal Vbst. Each multiplexer $30_j$ (j=1, 2, and 3) operates in accordance with an enable signal from a write enable line 40, selects an input $In_j$ from another block or a column select signal $SCL_j$, and sends the selected signal to the corresponding column wiring line $CL_j$. Each multiplexer $30_j$ (j=1, 2, and 3) selects the column select signal $SCL_j$ when writing (programming) is performed on the anti-fuse element $10_{ij}$ (i=1 and 2) connected to the corresponding column wiring line $CL_j$, and selects the input $In_j$ from another block when in a normal operation.

Figure 3A:
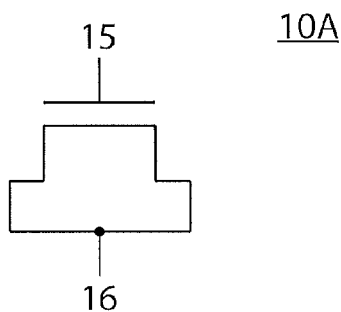
FIG. 3A is a diagram showing an anti-fuse element of a first specific example.

FIGS. 3A through 3D show first through fourth specific examples of anti-fuse elements that are used in each embodiment. As shown in FIG. 3A, a one time programmable (OTP) element formed with a transistor having a source and a drain connected to each other can be used as an anti-fuse element of the first specific example. The OTP memory element 10A shown in FIG. 3A includes a terminal 15 connected to the gate of the transistor, and a terminal 16 connected to the source and the drain of the transistor. Although the state between the terminals 15 and 16 is a high-resistance state in the initial condition, a leak path is formed in the gate insulating film by writing, so that the state between the terminals 15 and 16 can be changed to a low-resistance state. That is, the gate insulating film serves as a variable resistance layer, and this variable resistance layer irreversibly changes from a high-resistance state to a low-resistance state.

Figure 3B:
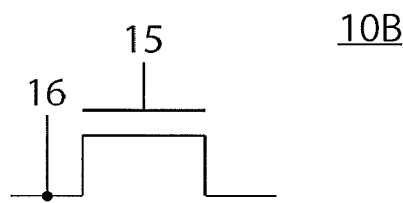
FIG. 3B is a diagram showing an anti-fuse element of a second specific example.

The anti-fuse element of the first specific example shown in FIG. 3A is the OTP memory element 10A formed with a transistor in which the gate is connected to the terminal 15, and the terminal 16 is connected to both the source and the drain. Meanwhile, an anti-fuse element 10B of the second specific example may be an OTP element formed with a transistor in which the terminal 15 is connected to the gate, and the terminal 16 is connected to the source or the drain, as shown in FIG. 3B. Each of these anti-fuse elements includes two electrodes (terminals), and the resistance state between the electrodes (terminals) can be set at a low-resistance state or a high-resistance state.

Figure 3C:
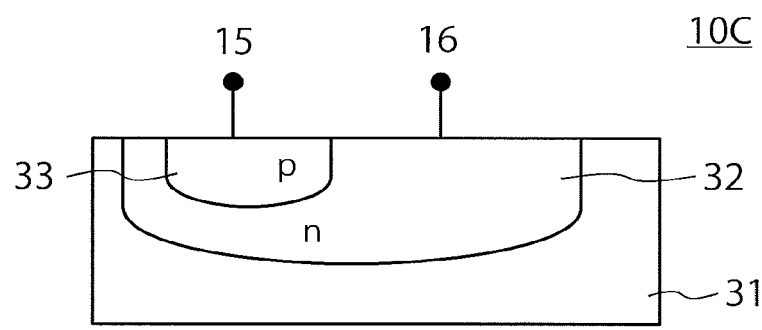
FIG. 3C is a diagram showing an anti-fuse element of a third specific example.

FIG. 3C is a cross-sectional view of the third specific example in which a pn junction is used as an anti-fuse element 10C, and writing is performed by applying a high reverse bias to the pn junction and breaking the pn junction. The anti-fuse element 10C of the third specific example includes an n-well 32 formed in a semiconductor layer 31, and a p-well 33 formed in the n-well 32. A program voltage (a write voltage) is applied to the n-well 32 via the terminal 16, and a voltage Vss is applied to the p-well 33 via the terminal 15. Alternatively, it is possible to form a pn junction by forming the n-well 32 in the p-well 33.

Figure 3D:
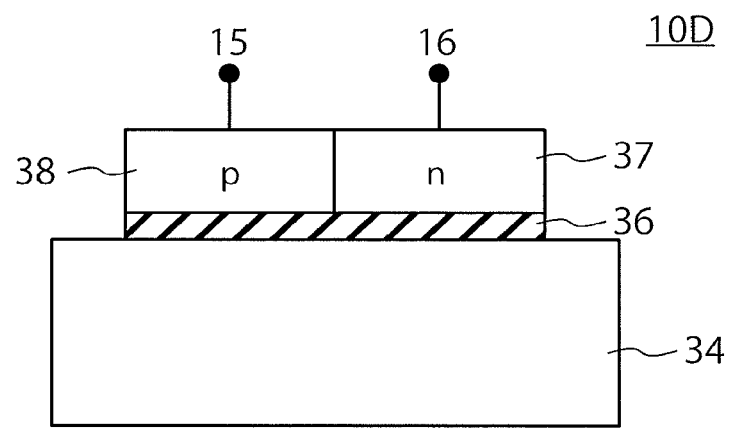
FIG. 3D is a diagram showing an anti-fuse element of a fourth specific example.

FIG. 3D is a cross-sectional view of the fourth specific example in which a pn junction formed with polysilicon is used as an anti-fuse element 10D, and writing is performed by applying a high reverse bias to the pn junction and breaking the pn junction. In the anti-fuse element 10D of the fourth specific example, an insulating film 36 is formed on a semiconductor layer 34, and an n-layer 37 and a p-type layer 38 that are formed with polysilicon are formed on the insulating film 36. The n-layer 37 and the p-type layer 38 can be formed by introducing an n-type impurity and a p-type impurity into the gate of a MOS transistor. The gate is formed with polysilicon. The pn junction can be formed, as any silicide is not added to the junction region of the pn junction. After the pn junction is formed, a high reverse bias voltage is applied to the pn junction via the terminal 15 and the terminal 16, so that the pn junction is broken. In a case where a pn junction is formed with polysilicon, it is possible to form a smaller pn junction than a pn junction formed in a case where wells are formed in a semiconductor layer.

Figure 4:
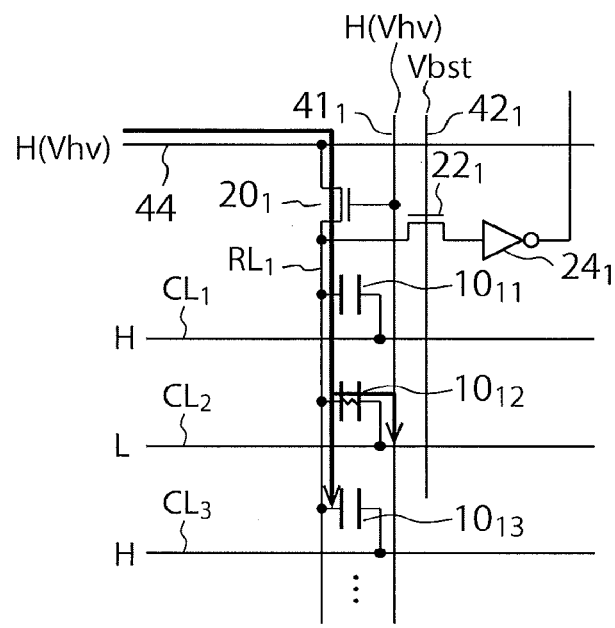
FIG. 4 is a diagram for explaining a write method in the switch block shown in FIG. 2.

In a switch block 130 having the above structure, writing is performed on at most one anti-fuse element at a maximum among the anti-fuse elements connected to the same row wiring line, and any writing is not performed on the other anti-fuse elements connected to the same row wiring line. This aspect is now described, with reference to FIG. 4. FIG. 4 is a diagram for explaining a case where writing is performed on the anti-fuse element $10_{12}$. In this case, a voltage Vhv for performing writing is applied to the wiring line 44.

Meanwhile, a high-level voltage (voltage Vdd, for example) is applied to the column wiring lines $CL_1$ and $CL_3$, and a low-level voltage (Vss, for example) is applied to the column wiring line $CL_2$. The difference in potential between the high-level voltage and Vhv is smaller than the breakdown voltage of the anti-fuse elements. Here, the cutoff transistor $22_1$ has a role in protecting the inverter $24_1$ from being broken due to the application of the write voltage Vhv. The difference in potential between the signal Vbst to be applied to the control line $42_1$ and Vhv is set at a smaller value than the breakdown voltage of the gate oxide film of the cutoff transistor $22_1$ and the gate oxide film of the inverter $24_1$. When Vhv is applied to $RL_1$, the source/drain potential of the cutoff transistor $22_1$ increases. When the voltage of the connecting terminal between the cutoff transistor $22_1$ and the inverter $24_1$ reaches the potential of Vbst, the difference in potential between the gate of the cutoff transistor $22_1$ and the connecting terminal becomes zero, and the cutoff transistor $22_1$ is put into an off-state. Consequently, the potential of the connecting terminal is prevented from increasing further. In this manner, the inverter $24_1$ is prevented from breaking down. The cutoff transistor $22_1$ is not broken, either, because the difference in potential between the gate (Vbst) and Vhv is smaller than the breakdown voltage of the gate insulating film. In this state, the voltage Vhv is applied to the control line $41_1$. Since the difference in potential between both ends of each of the anti-fuse elements $10_{11}$ and $10_{13}$ is smaller than the breakdown voltage, writing is not performed on the anti-fuse elements $10_{11}$ and $10_{13}$. As for the anti-fuse element $10_{12}$, however, the voltage Vhv is applied to one of the terminals, and the voltage Vss is applied to the other one of the terminals. Thus, writing is performed on the anti-fuse element $10_{12}$.

When writing is performed on one of the anti-fuse elements connected to the same row wiring line, or when writing is performed on the anti-fuse element $10_{12}$, for example, the anti-fuse element $10_{12}$ is put into a conductive state. Therefore, even if writing on one (the anti-fuse element $10_{11}$, for example) of the other anti-fuse elements $10_{11}$ and $10_{13}$ is tried, the write voltage Vhv is not applied between the two terminals of the anti-fuse element $10_{11}$, and writing cannot be performed.

Figure 5:
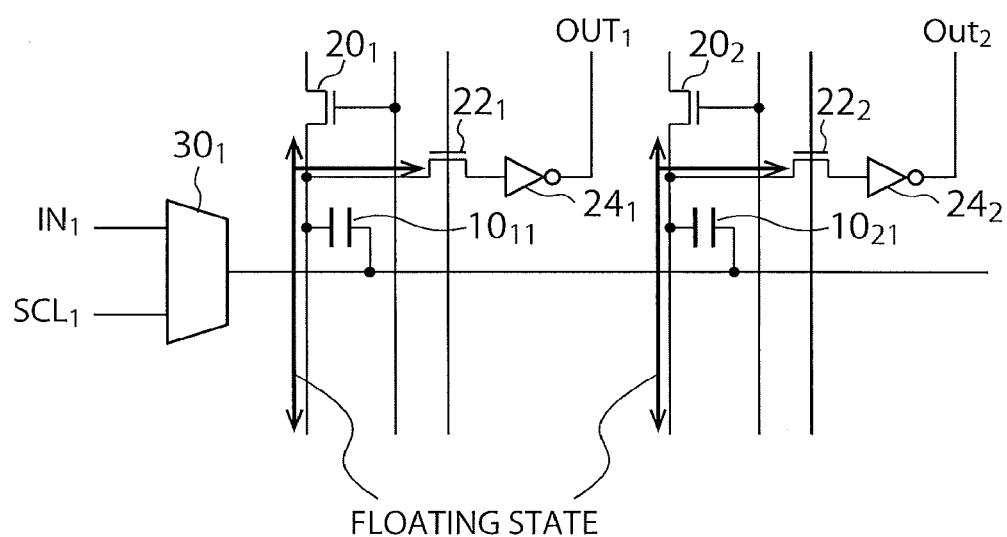
FIG. 5 is a diagram for explaining the problems with the switch block shown in FIG. 2.

In the switch block 130 shown in FIG. 2, the power supply is activated in the initial state where writing has not been performed on any of the anti-fuse elements, or in a state where writing has not been performed on any the anti-fuse elements connected to one or more (the row wiring lines $RL_1$ and $RL_2$, for example) of the row wiring lines. In this case, the select transistors $20_1$ and $20_2$ are in an off-state, and therefore, the potentials of the row wiring lines $RL_1$ and $RL_2$ are put into a floating state, as shown in FIG. 5. The cutoff transistors $22_i$ (i=1 and 2) are switched on by the value of the signal Vbst applied to the gates of the cutoff transistors $22_i$ and by the potentials of the row wiring lines $RL_1$ and $RL_2$ in a floating state, and the potentials on the input sides of the inverters $24_i$ become unstable (a floating state). That is, there is a possibility that inputs to the inverters $24_1$ and $24_2$ will become unstable, and the leakage current passing through the inverters $24_1$ and $24_2$ will increase. Further, due to this leakage current, more standby energy is consumed, and the power supply voltage drops accordingly. There also is a possibility that deterioration or breakdown will be caused by the heat generated from the inverters $24_1$ and $24_2$ due to the through-current, or by thermoelectrons (hot carriers).

In view of the above, the inventors have made intensive studies, and have invented integrated circuits capable of reducing the occurrence of the above problems. These integrated circuits will be described below as embodiments.

First Embodiment

Figure 6:
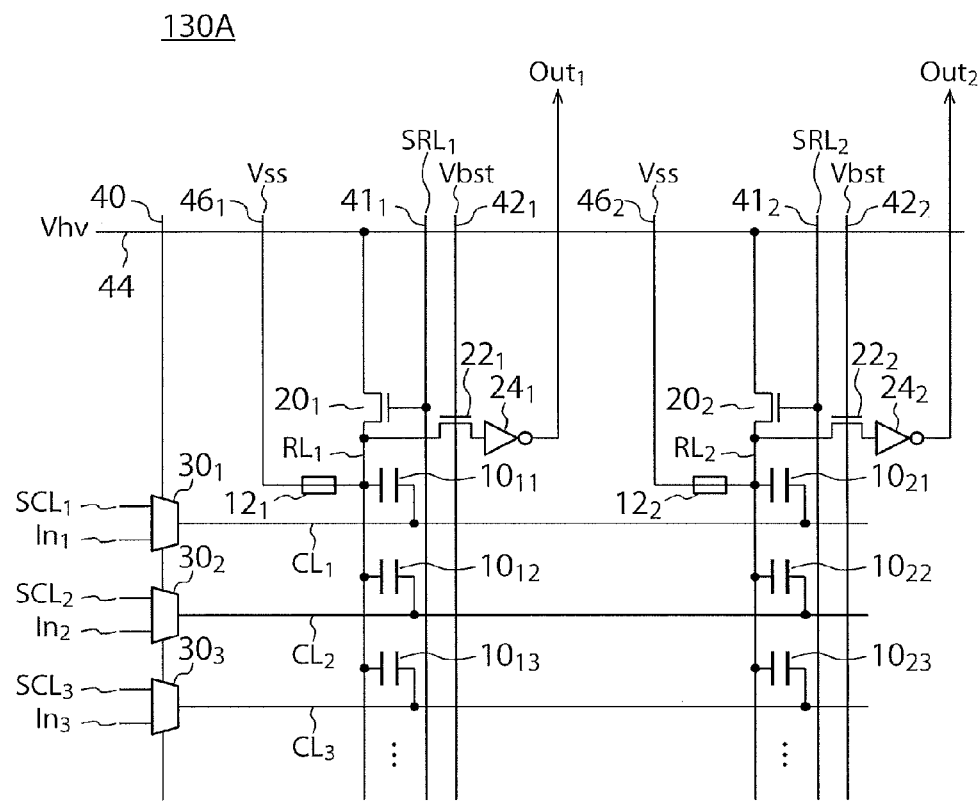
FIG. 6 is a circuit diagram showing an integrated circuit according to a first embodiment.

Referring now to FIG. 6, an integrated circuit according to a first embodiment is described. The integrated circuit of the first embodiment includes switch blocks, and one of the switch blocks is shown in FIG. 6.

A switch block 130A according to the first embodiment includes: row wiring lines $RL_1$ and $RL_2$; column wiring lines $CL_1$, $CL_2$, and $CL_3$ intersecting with the row wiring lines $RL_1$ and $RL_2$; output lines $Out_1$ and $Out_2$ corresponding to the row wiring lines $RL_1$ and $RL_2$; anti-fuse elements $10_{ij}$ provided in the intersection regions between the row wiring lines $RL_i$ (i=1 and 2) and the column wiring lines $CL_j$ (j=1, 2, and 3); fuse elements $12_i$ corresponding to the respective row wiring lines $RL_i$ (i=1 and 2); high-voltage select transistors $20_i$ corresponding to the respective row wiring lines $RL_i$ (i=1 and 2), each high-voltage select transistor $20_i$ having one of the source and the drain connected to a wiring line 44 and having the other one of the source and the drain connected to the corresponding row wiring line $RL_i$; cutoff transistors $22_i$ corresponding to the respective row wiring lines $RL_i$ (i=1 and 2); inverters $24_i$ provided between the cutoff transistors $22_i$ (i=1 and 2) and the output lines $Out_i$; and multiplexers $30_j$ corresponding to the respective column wiring lines $CL_j$ (j=1, 2, and 3). The withstand voltage of the gate oxide film of each of the select transistors $20_i$ (i=1 and 2) is higher than that in each of the cutoff transistors $22_i$.

Each anti-fuse element $10_{ij}$ (i=1 and 2, j=1, 2, and 3) has one terminal connected to the corresponding row wiring line $RL_i$, and has the other terminal connected to the corresponding column wiring line $CL_j$. Each fuse element $12_i$ (i=1 and 2) has one terminal connected to the corresponding row wiring line $RL_i$, and has the other terminal connected to a wiring line $46_i$ to which a voltage Vss is applied.

Each select transistor $20_i$ (i=1 and 2) has its gate connected to a control line $41_i$ that receives a row select signal $SRL_i$. Each cutoff transistor $22_i$ (i=1 and 2) has its gate connected to a control line $42_i$ that receives a signal Vbst. Each multiplexer $30_j$ (j=1, 2, and 3) operates in accordance with an enable signal from a write enable line 40, selects an input $In_j$ from another block or a column select signal $SCL_j$, and sends the selected signal to the corresponding column wiring line $CL_j$. Each multiplexer $30_j$ (j=1, 2, and 3) operates in accordance with an enable signal from a write enable line 40, selects an input $In_j$ from another block or a column select signal $SCL_j$, and sends the selected signal to the corresponding column wiring line $CL_j$. Each multiplexer $30_j$ (j=1, 2, and 3) selects the column select signal $SCL_j$ when writing (programming) is performed on the anti-fuse element $10_{ij}$ (i=1 and 2) connected to the corresponding column wiring line $CL_j$, and selects the input $In_j$ from another block when in a normal operation.

That is, the switch block 130A of the first embodiment differs from the switch block 130 shown in FIG. 2 in that the fuse elements $12_i$ each having one terminal connected to each corresponding row wiring line $RL_i$ and having the potential Vss to be applied to the other terminal are provided for the respective row wiring lines $RL_i$ (i=1 and 2).

The fuse elements 12 are formed with a metal material having a lower melting point than those of the materials of the respective kinds of wiring lines. Examples of materials that can be used for the fuse elements 12 include SnSb, BiSn, SnAg, ZnAl, and InSn.

(Operation at the Time of Power Activation)

Figure 7:
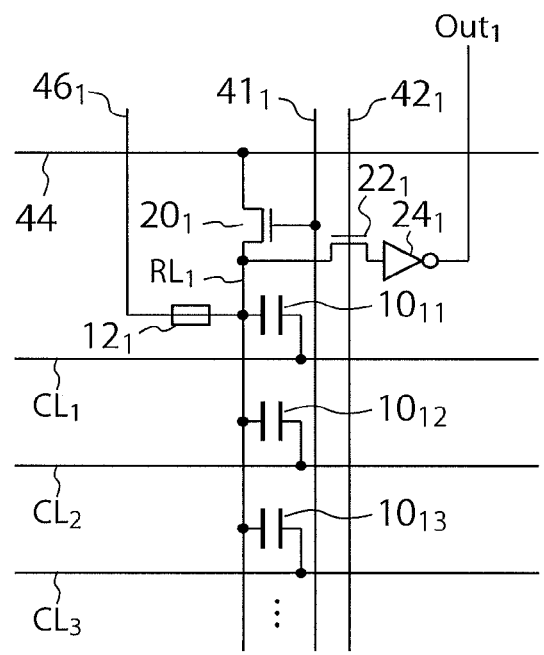
FIG. 7 is a diagram showing the initial state of the integrated circuit according to the first embodiment.
Figure 8:
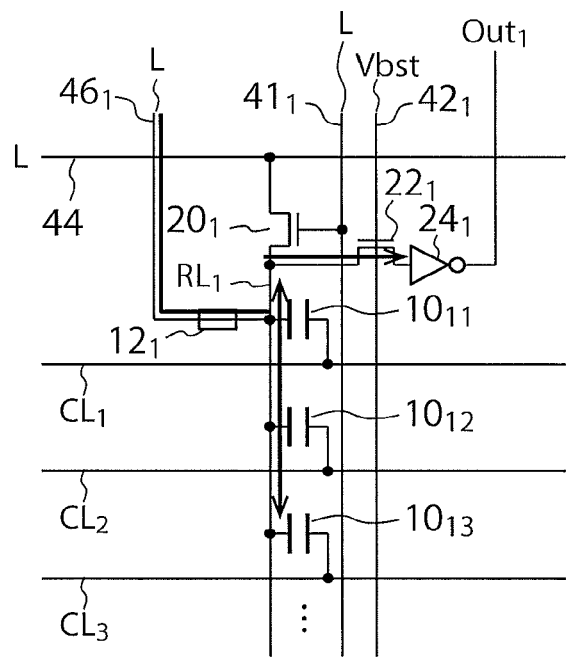
FIG. 8 is a diagram for explaining the state at a time when the power supply to the integrated circuit according to the first embodiment is activated.

The following is a description of the operation to be performed at a time when the power supply to the switch block 130A of the first embodiment is activated, with reference to FIGS. 7 and 8.

FIG. 7 is a diagram showing the state (the initial state) where writing has not been performed on any of the anti-fuse elements $10_{11}$, $10_{12}$, and $10_{13}$ connected to the row wiring line $RL_1$, which is one of the row wiring lines in the switch block 130A of the first embodiment. In the initial state, all the fuse elements $12_i$ (i=1 and 2) are not broken, but are conductive.

FIG. 8 shows the state at a time when the power supply to the anti-fuse elements $10_{11}$, $10_{12}$, and $10_{13}$ connected to the row wiring line $RL_1$ is activated. In this state, a low-level potential (a ground potential or Vss, for example) is applied to the control line $41_1$ and the wiring lines 44 and $46_1$. At this time, the row wiring line $RL_1$ is switched to a low-level potential by the fuse element $12_1$. Even if the value of the signal Vbst to be applied to the wiring line $42_1$ to which the gate of the cutoff transistor $22_1$ is connected becomes equal to the power supply voltage Vdd, a low-level potential is applied to the input terminal of the inverter $24_1$. Consequently, the cutoff transistor $22_i$ as an n-channel MOS transistor is put into an on-state, and the potential Vss is input to the input terminal of the inverter $24_i$ without fail. Thus, the through-current in the inverters $24_i$ (i=1 and 2) can be reduced. That is, the increase in the standby energy due to leakage current can be reduced, and the decrease in the power supply voltage can also be reduced. Further, the inverters $24_1$ and $24_2$ connected to the output terminals can be prevented from breaking down. The reason why the cutoff transistors are preferably n-channel MOS transistors will be described later.

(Write Operation)

Figure 9:
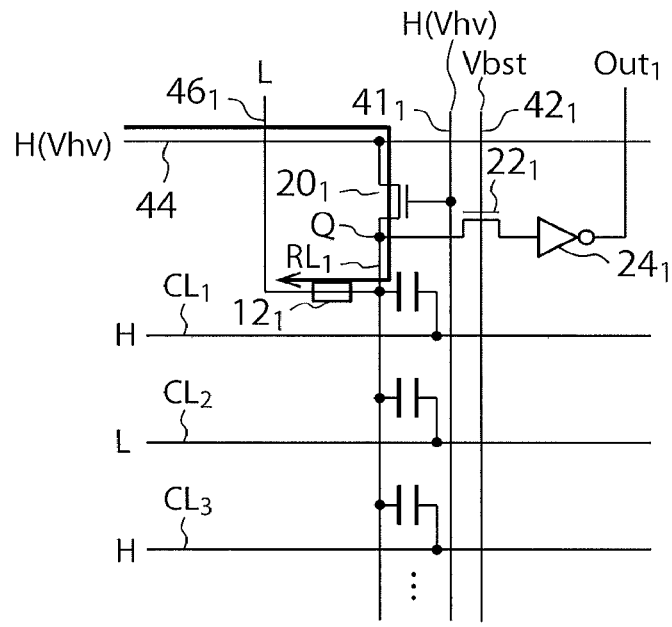
FIG. 9 is a diagram for explaining the first stage of writing in the integrated circuit according to the first embodiment.
Figure 10:
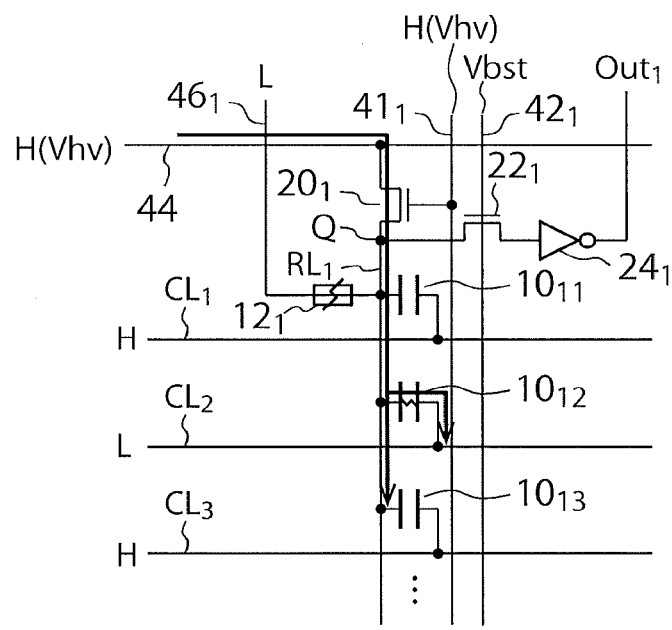
FIG. 10 is a diagram for explaining the second stage of writing in the integrated circuit according to the first embodiment.

Referring now to FIGS. 9 and 10, a write operation to be performed on the switch block 130A of the first embodiment is described.

FIG. 9 is a diagram for explaining the first stage of writing on the anti-fuse element $10_{12}$. First, a multiplexer $30_j$ (j=1, 2, and 3) selects the column select signal $SCL_j$ in accordance with an enable signal from the write enable line 40. At this time, the column select signals $SCL_1$, $SCL_2$, and $SCL_3$ are at the high level (hereinafter also referred to as the H level), the low level (hereinafter also referred to as the L level), and the H level, respectively, and the high-level potential Vdd is applied to the column wiring lines $CL_1$ and $CL_3$, accordingly. Meanwhile, the high voltage Vhv for writing is applied to the control line $41_1$ and the wiring line 44, and the low-level potential Vss is applied to the column wiring line $CL_2$ to which the anti-fuse element $10_{12}$ is connected. That is, the potential for writing on the anti-fuse elements connected to the column wiring lines $CL_1$, $CL_2$, and $CL_3$ is given to the corresponding column select signals $SCL_1$, $SCL_2$, and $SCL_3$, respectively. For example, a low-level potential is given to the column select signal corresponding to the anti-fuse element on which writing is to be performed, and a high-level potential is given to the column select signals corresponding to the anti-fuse elements on which writing is not to be performed.

At this time, the select transistor $20_1$ is put into an on-state, and a large current corresponding to the voltage flows in the fuse element $12_1$. In FIG. 9, the potential of a connection node Q between the row wiring line $RL_1$ and the source or the drain of the cutoff transistor $22_1$ is determined by the resistance ratio between the select transistor $20_1$ and the fuse element $12_1$. The resistance of a fuse element is normally much lower than the resistance of a transistor. Therefore, the voltage is applied mainly to the select transistor $20_1$, and the potential of the node Q is almost equal to Vss. Thus, the anti-fuse elements $10_{11}$, $10_{12}$, and $10_{13}$ are not broken in this stage. However, a large current flows in the fuse element $12_1$, and therefore, the fuse element $12_1$ will be fused after a while.

Although the select transistor $20_1$ is an n-channel MOS transistor in FIG. 9, the select transistor $20_1$ may be a p-channel MOS transistor. In such a case, the control signal to be applied to the gate of the select transistor $20_1$ has the opposite polarity.

FIG. 10 shows the second stage of the writing after the fuse element $12_1$ is fused. Since the fuse element $12_1$ is fused, breaking occurs, and the high voltage Vhv is applied to the node Q. As a result, the anti-fuse element $10_{12}$ having the low-level potential Vss applied to its one terminal is broken and becomes conductive. In a case where the cutoff transistor $22_1$ is a p-channel MOS transistor, when a higher voltage than the power supply voltage Vdd is applied, the relationship between the substrate and the source/drain is in a forward direction of diodes. As a result, current flows, and the write voltage becomes lower. For this reason, the cutoff transistor $22_1$ is preferably an n-channel MOS transistor.

As described above, because of the existence of the select transistor $20_1$, most of the divided high voltage Vhv is applied to the select transistor $20_1$. As a result, the potential of the node Q becomes almost equal to the low-level potential Vss, and it becomes possible to perform an operation not to write on the anti-fuse elements $10_{11}$, $10_{12}$, and $10_{13}$ before the fuse element $12_1$ is fused. In a case where the select transistor does not exist, the anti-fuse element is broken before the fuse element is fused, most current flows into the anti-fuse element, and the fuse element side might not be fused.

As described above, in the switch block 130A of the first embodiment, writing can be performed at most one anti-fuse element among the anti-fuse elements connected to a row wiring line $RL_i$ (i=1 and 2). That is, writing is performed on at most one anti-fuse element among the anti-fuse elements connected to the same row wiring line.

(Normal Operation)

Figure 11:
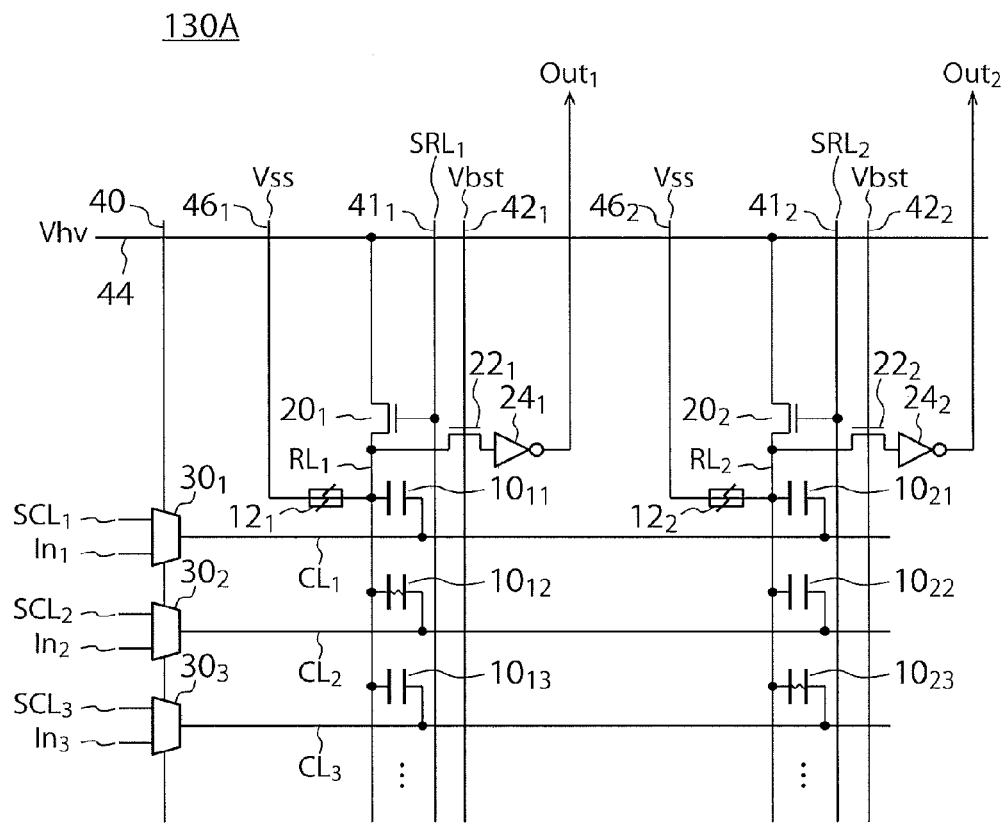
FIG. 11 is a diagram for explaining a normal operation of the integrated circuit according to the first embodiment.

Referring now to FIG. 11, a normal operation (a read operation) in the switch block 130A of the first embodiment on which writing has been performed is described. FIG. 11 is a diagram showing a state where writing has been performed on the anti-fuse elements $10_{12}$ and $10_{23}$ in the switch block 130A of the first embodiment. That is, the anti-fuse elements $10_{12}$ and $10_{23}$ are conductive, and the fuse elements $12_1$ and $12_2$ are broken. In this normal operation, each select transistor $20_i$ (i=1 and 2) is in an off-state, and each cutoff transistor $22_i$ is in an on-state.

In this state, an input $In_j$ (j=1, 2, and 3) from another block is selected by a multiplexer $30_j$, and the selected input $In_j$ is sent to the corresponding column wiring line $CL_j$. Signals in accordance with the values of the inputs $In_1$ through $In_3$ and the information written in the anti-fuse elements of the switch block 130A are output from the output lines $Out_1$ and $Out_2$. In a case where the inputs $In_1$ and $In_3$ are H-level signals, and the input $In_2$ is a L-level signal, for example, a H-level signal is output from the output line $Out_1$, but a L-level signal is output from the output line $Out_2$. In a case where the inputs $In_1$ and $In_2$ are H-level signals, and the input $In_3$ is a L-level signal, a H-level signal is output from the output line $Out_2$, but a L-level signal is not output from the output line $Out_1$.

In the above manner, signals in accordance with the values of the inputs $In_1$ through $In_3$ selected by the multiplexers $30_j$ (j=1, 2, and 3) and the information written in the anti-fuse elements of the switch block 130A are output from the output lines $Out_1$ and $Out_2$. In FIG. 11, writing is performed on the anti-fuse elements $10_{12}$ and $10_{23}$ connected to different column wiring lines. However, writing may be performed on anti-fuse elements connected to the same column wiring line, such as the anti-fuse elements $10_{12}$ and $10_{22}$. In this case, if the inputs $In_1$ and $In_3$ are H-level signals, and the input $In_2$ is a L-level signal, H-level signals are output from the output line $Out_1$ and the output line $Out_2$. In the above manner, each multiplexer $30_j$ (j=1, 2, and 3) forms a drive circuit that supplies a potential in accordance with an operation to one terminal of the corresponding anti-fuse element.

As described above, according to the first embodiment, the increase in the standby energy due to leakage current can be reduced, and the inverters connected to the output terminals of memories can be prevented from breaking down.

Second Embodiment

Figure 12:
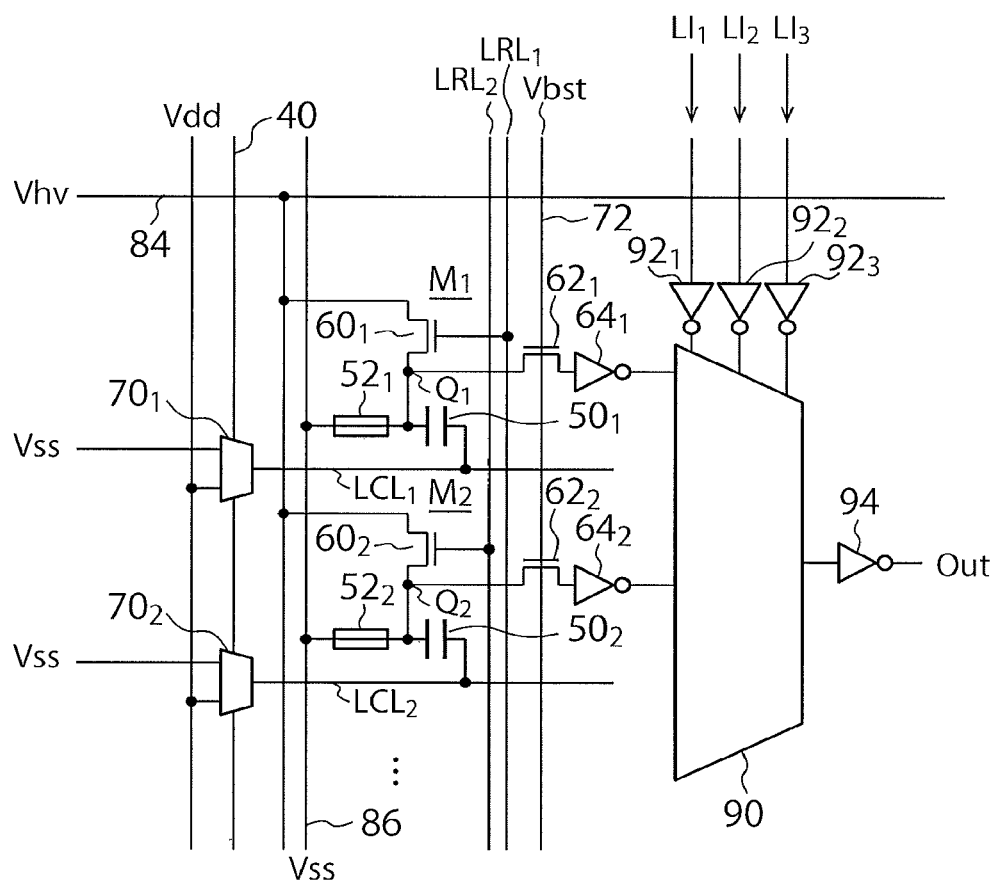
FIG. 12 is a circuit diagram showing an integrated circuit according to a second embodiment.

Referring now to FIG. 12, an integrated circuit according to a second embodiment is described. The integrated circuit of the second embodiment includes a look-up table, and the look-up table circuit is shown in FIG. 12.

A look-up table circuit 140 of the second embodiment includes memory cells $M_i$ (i=1 and 2), multiplexers $70_i$ corresponding to the respective memory cells $M_i$, a multiplexer 90, inverters $92_1$, $92_2$, and $92_3$, and an inverter 94.

Each memory cell $M_i$ (i=1 and 2) includes an anti-fuse element $50_i$, a fuse element $52_i$, a high-voltage select transistor $60_i$, a cutoff transistor $62_i$ formed with an n-channel MOS transistor, and an inverter $64_i$. The break-down voltage of the gate oxide film of each of the select transistors $60_i$ (i=1 and 2) is higher than that in each of the cutoff transistors $62_i$.

Each anti-fuse element $50_i$ (i=1 and 2) has one terminal connected to a column wiring line $LCL_i$, and has the other terminal connected to a node $Q_i$. Each fuse element $52_i$ (i=1 and 2) has one terminal connected to the node $Q_i$, and has the other terminal connected to a wiring line 86. A low-level potential Vss is applied to the wiring line 86.

As for each select transistor $60_i$ (i=1 and 2), one of the source and the drain is connected to a wiring line 84, the other one of the source and the drain is connected to the node $Q_i$, and the gate is connected to a row wiring line $LRL_i$. As for each cutoff transistor $62_i$ (i=1 and 2), one of the source and the drain is connected to the node $Q_i$, the other one of the source and the drain is connected to the input terminal of the inverter $64_i$, and the gate is connected to a control line 72. Each inverter $64_i$ (i=1 and 2) has its output terminal connected to the input terminal of the multiplexer 90.

In accordance with input signals $LI_1$, $LI_2$, and $LI_3$ that are input via the inverters $92_1$, $92_2$, and $92_3$, the multiplexer 90 selects one of the signals sent from the inverters $64_1$ and $64_2$, and transmits the selected signal to an output line Out via the inverter 94.

In accordance with an enable signal from a write enable line 40, each multiplexer $70_i$ (i=1 and 2) selects the low-level potential Vss or a high-level potential Vdd, and sends the selected potential to the column wiring line $LCL_i$. Each multiplexer $70_i$ (i=1 and 2) selects the low-level potential Vss when writing (programming) is performed on the anti-fuse element $50_i$ (i=1 and 2) connected to the column wiring line $LCL_i$, and selects the high-level potential Vdd when in a normal operation.

Figure 13:
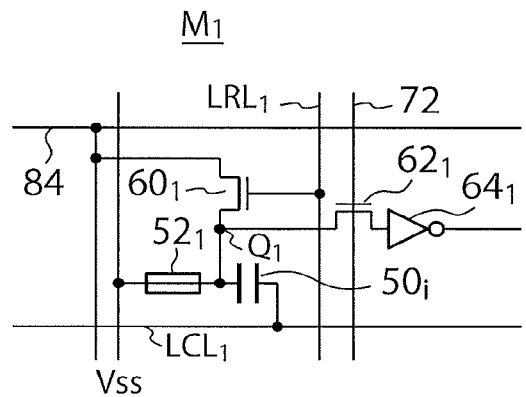
FIG. 13 is a diagram showing the initial state of the integrated circuit according to the second embodiment.
Figure 14:
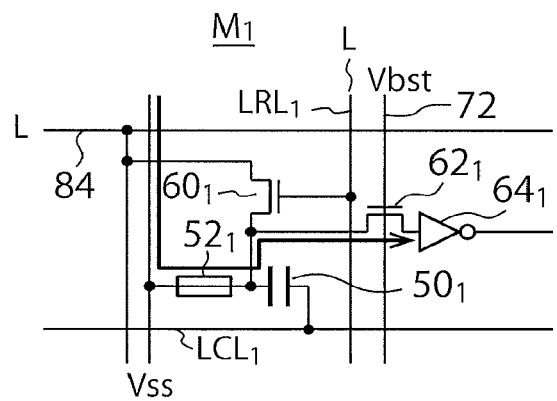
FIG. 14 is a diagram for explaining the state at a time when the power supply to the integrated circuit according to the second embodiment is activated.

The following is a description of the operation to be performed at a time when the power supply to the look-up table circuit 140 of the second embodiment is activated, with reference to FIGS. 13 and 14.

(Operation at the Time of Power Activation)

FIG. 13 is a diagram showing a state where writing has not been performed on the memory cell $M_1$. In this state, the fuse element $52_1$ is not broken, and is conductive.

FIG. 14 shows the state at a time when the power supply is activated. In this state, a low-level potential (a ground potential or Vss, for example) is applied to the row wiring line $LRL_1$ and the wiring line 84. At this time, the select transistor $60_1$ is in an off-state, and therefore, the node $Q_1$ is switched to a low-level potential by the fuse element $52_1$. Even if the value of the signal Vbst to be applied to a wiring line 72 to which the gate of the cutoff transistor $62_1$ is connected becomes equal to the power supply voltage Vdd, a low-level potential is applied to the input terminal of the inverter $64_1$. Consequently, the cutoff transistor $62_1$ is put into an on-state, and the potential Vss is input to the input terminal of the inverter $64_1$ without fail. Thus, the through-current in the inverters $64_1$ can be reduced. That is, the increase in the standby energy due to leakage current can be reduced, and the decrease in the power supply voltage can also be reduced. Further, the inverters $64_1$ and $64_2$ connected to the output terminal can be prevented from breaking down.

(Write Operation)

Figure 15:
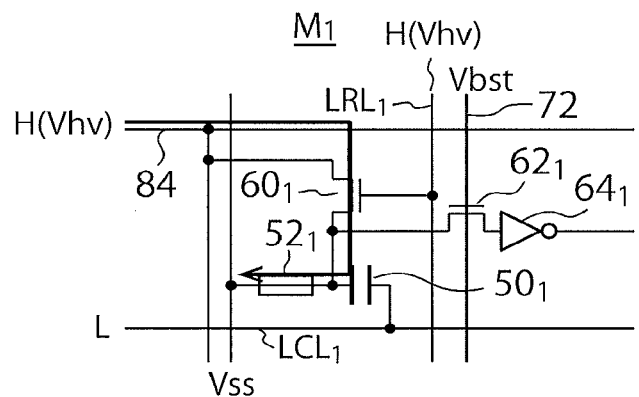
FIG. 15 is a diagram for explaining the first stage of writing in the integrated circuit according to the second embodiment.
Figure 16:
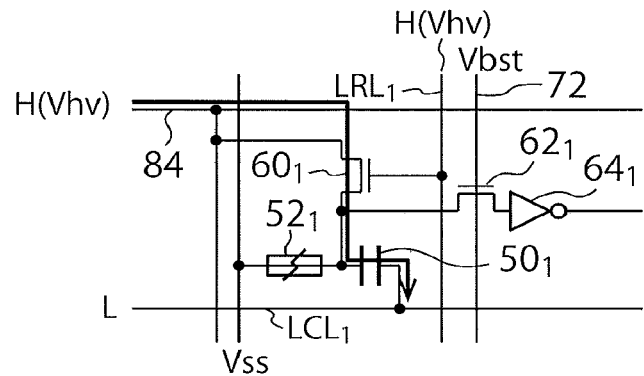
FIG. 16 is a diagram for explaining the second stage of writing in the integrated circuit according to the second embodiment.

Referring now to FIGS. 15 and 16, a write operation to be performed on the look-up table circuit 140 of the second embodiment is described.

FIG. 15 is a diagram for explaining the first stage of writing on the memory cell $M_1$. First, each multiplexer $70_i$ (i=1 and 2) selects the low-level potential Vss in accordance with an enable signal from the write enable line 40. In a case where memory cell writing is performed on the memory cell $M_1$, the low-level potential Vss is selected by the multiplexer $70_1$, and the low-level potential Vss is selected by the multiplexer $70_2$. A high voltage Vhv for writing is applied to the row wiring line $LRL_1$ and the wiring line 84.

At this time, the select transistor $60_1$ is put into an on-state, and a large current corresponding to the voltage flows in the fuse element $52_1$. In FIG. 15, the potential of the node $Q_1$ is determined by the resistance ratio between the select transistor $60_1$ and the fuse element $52_1$. The resistance of a fuse element is normally much lower than the resistance of a transistor. Therefore, the voltage is applied mainly to the select transistor $60_1$, and the potential of the node $Q_1$ is almost equal to Vss. Thus, the anti-fuse element $50_1$ is not broken in this stage. However, a large current flows in the fuse element $62_1$, and therefore, the fuse element $62_1$ will be fused after a while.

Meanwhile, the high voltage Vhv is applied to the row wiring line $LRL_2$, and the select transistor $60_2$ is put into an off-state. As the low-level potential Vss is applied to the column wiring line $LCL_2$, no voltage is applied to the fuse element $50_2$, and therefore, no current flows therein.

Although the select transistor $60_1$ is an n-channel MOS transistor in FIG. 12, the select transistor $60_1$ may be a p-channel MOS transistor. In such a case, the control signal to be applied to the gate of the select transistor $60_1$ has the opposite polarity.

FIG. 16 shows the second stage of the writing after the fuse element $52_1$ is fused. Since the fuse element $52_1$ is fused, breaking occurs, and the high voltage Vhv is applied to the node $Q_1$. As a result, the anti-fuse element $50_1$ having the low-level potential Vss applied to its one terminal is broken and becomes conductive.

As described above, because of the existence of the select transistor $60_1$, most of the divided high voltage Vhv is applied to the select transistor $60_1$. As a result, the potential of the node $Q_1$ becomes almost equal to the low-level potential Vss, and it becomes possible to perform an operation not to write on the anti-fuse elements $50_1$ before the fuse element $52_1$ is fused. In a case where the select transistor does not exist, the anti-fuse element is broken before the fuse element is fused, most current flows into the anti-fuse element, and the fuse element side might not be fused.

In the above described manner, writing can be performed on the anti-fuse elements $50_i$ included in the respective memory cells $M_i$ (i=1 and 2) in the look-up table circuit 140 of the second embodiment.

(Normal Operation)

In a normal operation (a read operation) in the look-up table circuit 140 of the second embodiment on which writing has been performed, signals in accordance with high-level signals (=Vdd) selected by the multiplexers $70_i$ (i=1 and 2) and the information written in the anti-fuse elements of the look-up table circuit 140 are sent to the multiplexer 90 via the inverters $64_1$ and $64_2$. In accordance with the input signals $LI_1$, $LI_2$, and $LI_3$, the multiplexer 90 selects one of the signals sent from the inverters $64_1$ and $64_2$, and transmits the selected signal to the output line Out via the inverter 94. In an example case, writing has been performed on the memory cell $M_1$, and writing has not been performed on the memory cell $M_2$. In this case, the anti-fuse element $50_1$ is conductive, and the fuse element $52_1$ is broken. However, the anti-fuse element $50_2$ is not conductive, and the fuse element $52_2$ is not broken. Also, each select transistor $60_i$ (i=1 and 2) is in an off-state, and each cutoff transistor $62_i$ is in an on-state.

In this state, the value (=Vdd) of the signal selected by the multiplexers $70_i$ (i=1 and 2) are applied to the respective column wiring lines $LCL_i$. As a result, a L-level signal from the inverter $64_1$, and a H-level signal from the inverter $64_2$ are sent to the multiplexer 90. In accordance with the input signals $LI_1$, $LI_2$, and $LI_3$, the multiplexer 90 selects one of the signals sent from the inverters $64_1$ and $64_2$. If the multiplexer 90 selects the signal sent from the inverter $64_1$, a L-level signal is sent to the inverter 94, and a H-level signal is sent to the output line Out. If the multiplexer 90 selects the signal sent from the inverter $64_2$, a H-level signal is sent to the inverter 94, and a L-level signal is sent to the output line Out. In the above manner, each multiplexer $70_i$ (i=1 and 2) forms a drive circuit that supplies a potential in accordance with an operation to one terminal of the corresponding anti-fuse element.

As described above, according to the second embodiment, the increase in the standby energy due to leakage current can be reduced, and the inverters connected to the output terminal of a memory can be prevented from breaking down.

(Modification)

Figure 17:
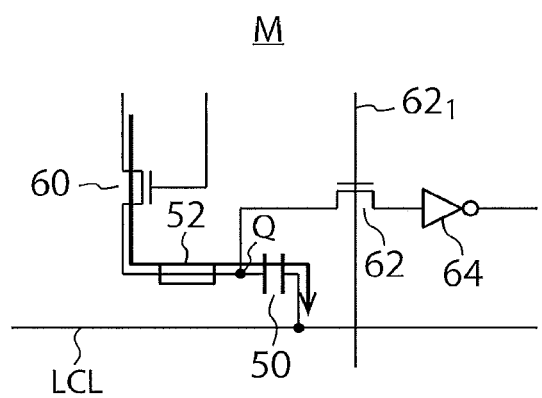
FIG. 17 is a diagram showing a memory cell of an integrated circuit according to a modification of the second embodiment.

Referring now to FIG. 17, a look-up table circuit according to a modification of the second embodiment is described.

The look-up table circuit of this modification differs from the look-up table circuit 140 of the second embodiment shown in FIG. 12, in that each of the memory cells $M_1$ and $M_2$ is replaced with a memory cell M shown in FIG. 17.

In this memory cell shown in FIG. 17, a select transistor 60, a fuse element 52, and an anti-fuse element 50 are connected in series.

In this modification, all the select transistors 60 are in an on-state in the initial condition, and a constant voltage is applied by the fuse elements 52. In writing, the fuse element 52 is broken by the current that flows after the anti-fuse element 50 is broken.

In this modification, however, the fuse element 52 is broken after writing on a memory cell, so that the anti-fuse element 50 is made inaccessible. Consequently, a check cannot be made to determine whether writing has been performed on the memory cell, and additional writing cannot be performed.

In the second embodiment shown in FIG. 12, on the other hand, access can be again made after writing has been performed on an anti-fuse element, and it is possible to read from the memory cell and to perform additional writing on the memory cell.

Third Embodiment

Figure 18:
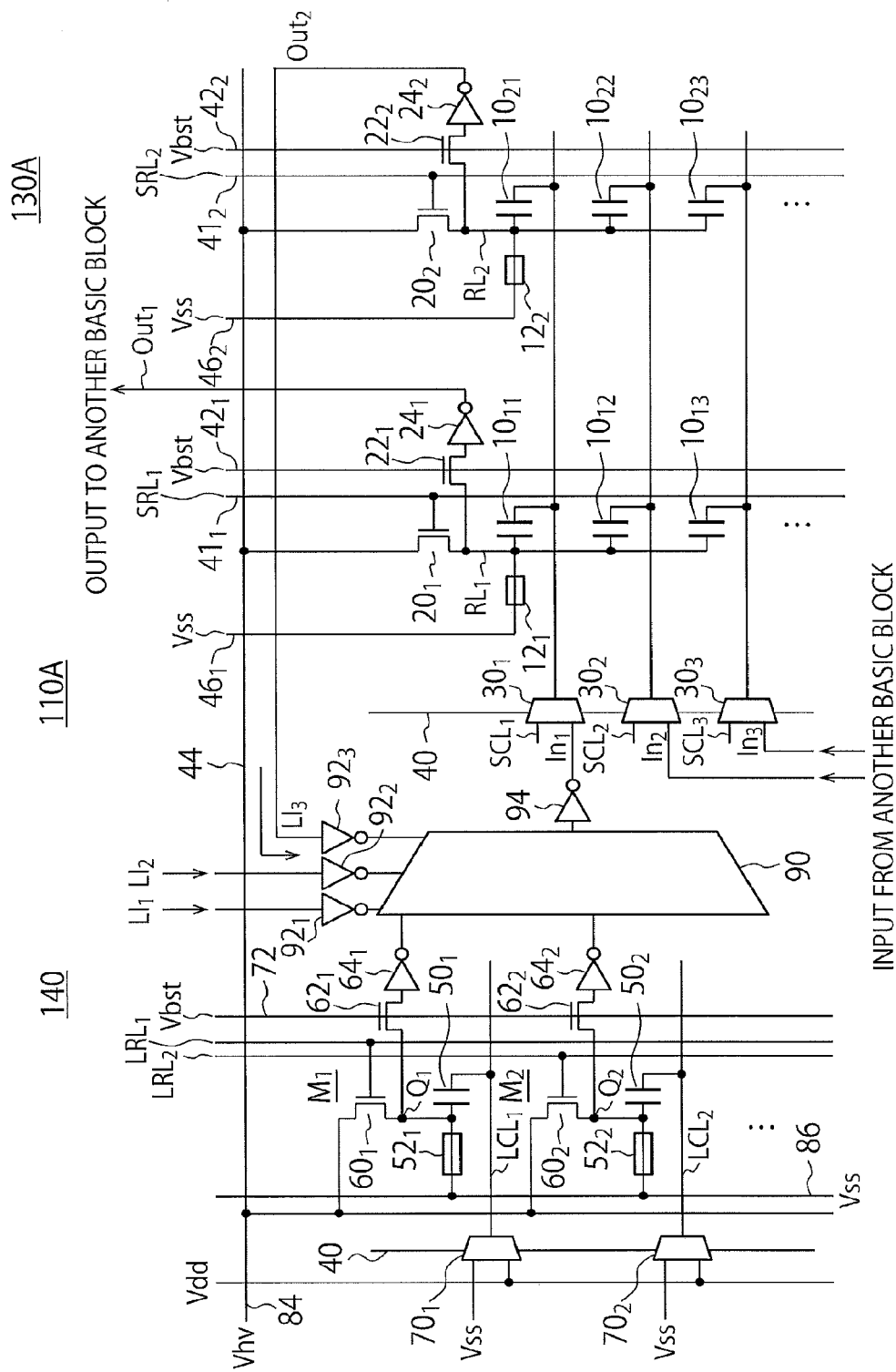
FIG. 18 is a circuit diagram showing an integrated circuit according to a third embodiment.

FIG. 18 shows an integrated circuit according to a third embodiment. The integrated circuit of the third embodiment includes a basic block 110A. This basic block 110A includes the switch block 130A of the first embodiment shown in FIG. 6, and the look-up table circuit 140 of the second embodiment shown in FIG. 12.

In the basic block 110A of the third embodiment, the wiring line 44 of the switch block 130A and the wiring line 84 of the look-up table circuit 140 are connected.

In the look-up table circuit 140, the low-level potential Vss is applied to one terminal of each of the multiplexers $70_i$ (i=1 and 2), and the high-level potential Vdd is applied to the other terminal. In accordance with an enable signal from the write enable line 40, each multiplexer $70_i$ (i=1 and 2) selects the low-level potential Vss or the high-level potential Vdd. In a case where writing is performed on the anti-fuse elements $50_1$ and $50_2$, the low-level potential Vss is selected by each multiplexer $70_i$ (i=1 and 2). In a case where a normal operation is performed by the look-up table circuit 140, the high-level potential Vdd is selected by each multiplexer $70_i$ (i=1 and 2).

In the switch block 130A, the multiplexer $30_1$ receives the column select signal $SCL_1$ at one terminal, and receives the output of the inverter 94 of the look-up table circuit 140 at the other terminal. Each multiplexer $30_j$ (j=2 and 3) receives the column select signal $SCL_j$ at one terminal, and receives an input $In_j$ from another basic block at the other terminal. In accordance with an enable signal from the write enable line 40, each multiplexer $30_j$ (j=2 and 3) selects the column select signal $SCL_j$ or the input $In_j$ from another basic block. In a case where writing is performed on at least one of the anti-fuse elements $10_{11}$ through $10_{23}$, the column select signal $SCL_j$ is selected by each multiplexer $30_j$ (j=1, 2, and 3). In a case where the switch block 130A performs a normal operation, the multiplexer $30_1$ selects the output of the inverter 94 of the look-up table circuit 140, and each multiplexer $30_j$ (j=1, 2, and 3) selects the input $In_j$ from another basic block.

In the switch block 130A, the signal that is output from the output line $Out_1$ is an input signal that is input to the look-up table circuit of another basic block. The signal that is output from the output line $Out_2$ is the input signal $LI_3$ that is input to the look-up table circuit 140 in the same basic block 110A. The input signals $LI_1$ and $LI_2$ that are input to the look-up table circuit 140 are sent from other basic blocks.

The integrated circuit of the third embodiment having the above structure can achieve the same effects as those of the first embodiment, and can also achieve the same effects as those of the second embodiment. That is, like the first and second embodiments, the third embodiment can reduce the increase in the standby energy due to leakage current, and also reduce the decrease in the power supply voltage.

Further, the inverters $24_1$, $24_2$, $64_1$, and $64_2$ can be prevented from breaking down.

Fourth Embodiment

Figure 19:
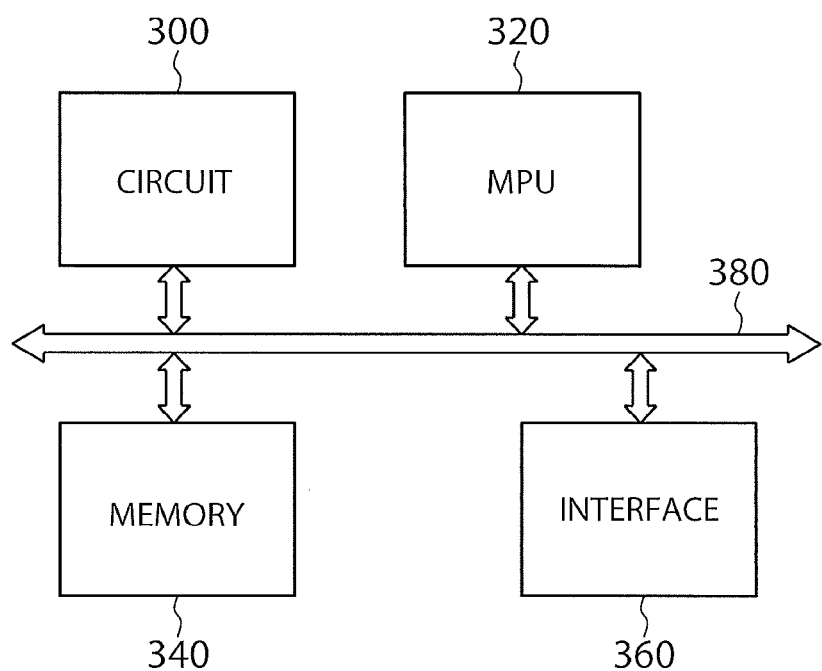
FIG. 19 is a block diagram showing an integrated circuit according to a fourth embodiment.

FIG. 19 shows an integrated circuit apparatus according to a fourth embodiment. The integrated circuit apparatus of the fourth embodiment includes a circuit 300 including one of the integrated circuits of the first through third embodiments, a microprocessor (hereinafter also referred to as the MPU (Micro-Processing Unit)) 320, a memory 340, and an interface 360. These components are connected to one another via a bus line 380.

The MPU 320 operates in accordance with a program. The program for the MPU 320 to operate is stored beforehand into the memory 340. The memory 340 is also used as a work memory for the MPU 320 to operate. The interface 360 communicates with an external device, under the control of the MPU 320.

The fourth embodiment can also achieve the same effects as those of the first through third embodiments.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the sprit of the inventions. The accompanying claims and their equivalents are intended to cover such forms or modifications as would fail within the scope and sprit of the invention.

The invention claimed is:

1. An integrated circuit comprising:
   an anti-fuse element including a first terminal and a second terminal;
   a fuse element including a third terminal connected to the second terminal, and a fourth terminal;
   a first wiring line connected to the first terminal of the anti-fuse element;
   a drive circuit configured to supply first and second potentials to the first terminal of the anti-fuse element, the drive circuit being connected to the first wiring line, the first and second potentials being different from each other;
   second through fourth wiring lines;
   an inverter;
   a first transistor including a first source, a first drain, and a first gate, the first gate being connected to the second wiring line, one of the first source and the first drain being connected to the third wiring line, and the other one of the first source and the first drain being connected to the second terminal and the third terminal; and
   a second transistor including a second source, a second drain, and a second gate, the second gate being connected to the fourth wiring line, one of the second source and the second drain being connected to the second terminal and the third terminal, and the other one of the second source and the second drain being connected to an input terminal of the inverter.

2. The circuit according to claim 1, wherein the fourth terminal of the fuse element is connected to a ground power supply.

3. The circuit according to claim 1, wherein:
   the anti-fuse element is a transistor including a source, a drain, and a gate;
   when the first terminal is the gate, the second terminal is at least one of the source and the drain; and
   when the first terminal is at least one of the source and the drain, the second terminal is the gate.

4. The circuit according to claim 1, wherein the anti-fuse element is a pn junction.

5. The circuit according to claim 1, wherein the fuse element is a metal.

6. An integrated circuit comprising:
   first and second anti-fuse elements each including a first terminal and a second terminal;
   a fuse element including a third terminal connected to the second terminals of the first and second anti-fuse elements, and a fourth terminal;
   a first wiring line connected to the first terminal of the first anti-fuse element and a second wiring line connected to the first terminal of the second anti-fuse element;
   a drive circuit configured to supply first and second potentials to the first terminal of each of the first and second anti-fuse elements via the corresponding one of the first and second wiring lines, the first and second potentials being different from each other;
   third through fifth wiring lines;
   an inverter;
   a first transistor including a first source, a first drain, and a first gate, the first gate being connected to the third wiring line, one of the first source and the first drain being connected to the fourth wiring line, and the other one of the first source and the first drain being connected to the second terminals and the third terminal; and
   a second transistor including having a second source, a second drain, a second gate, the second gate being connected to the fifth wiring line, one of the second source and the second drain being connected to the second terminals and the third terminal, and the other one of the second source and the second drain being connected to an input terminal of the inverter.

7. The circuit according to claim 6, wherein the fourth terminal of the fuse element is connected to a ground power supply.

8. The circuit according to claim 6, wherein:
   each of the first and second anti-fuse elements is a transistor including a source, a drain, and a gate;
   when the first terminal is the gate, the second terminal is at least one of the source and the drain; and
   when the first terminal is at least one of the source and the drain, the second terminal is the gate.

9. The circuit according to claim 6, wherein each of the first and second anti-fuse elements is a pn junction.

10. The circuit according to claim 6, wherein the fuse element is a metal.

11. An integrated circuit comprising:
    first and second wiring lines;
    third and fourth wiring lines corresponding to the first and second wiring lines respectively;
    a fifth wiring line and a sixth wiring line;
    first and second cells corresponding to the first and second wiring lines respectively, each of the first and second cells including:
      an anti-fuse element including a first terminal connected to the corresponding one of the first and second wiring lines, and a second terminal;
      a fuse element including a third terminal connected to the second terminal, and a fourth terminal;
      an inverter;
      a first transistor including a first source, a first drain, a first gate, the first gate being connected to the corresponding one of the third and fourth wiring lines, one of the first source and the first drain being connected to the fifth wiring line, and the other one of the first source and the first drain being connected to the second terminal and the third terminal; and
      a second transistor including a second source, a second drain, a second gate, the second gate being connected to the sixth wiring line, one of the second source and the second drain being connected to the second terminal and the third terminal, and the other one of the second source and the second drain being connected to an input terminal of the inverter;

a drive circuit configured to supply first and second potentials to the first terminal of each of the first and second anti-fuse elements via the corresponding one of the first and second wiring lines, the first and second potentials being different from each other; and a first multiplexer configured to select one of outputs from the inverters of the first and second cells in accordance with an input signal, and output the selected output.

12. The circuit according to claim 11, wherein the drive circuit includes second and third multiplexers corresponding to the first and second wiring lines respectively, the second and third multiplexers including an output terminal connected to corresponding one of the first and second wiring lines respectively.

13. The circuit according to claim 11, wherein the fourth terminals of the fuse elements are connected to a ground power supply.

14. The circuit according to claim 11, wherein:
each of the first and second anti-fuse elements is a third transistor including a third source, a third drain, and a third gate;
when the first terminal of each of the first and second anti-fuse elements is the third gate, the second terminal of each of the first and second anti-fuse elements is at least one of the third source and the third drain; and
when the first terminal of each of the first and second anti-fuse elements is at least one of the third source and the third drain, the second terminal of each of the first and second anti-fuse elements is the third gate.

15. The circuit according to claim 11, wherein each of the first and second anti-fuse elements is a pn junction.

16. The circuit according to claim 11, wherein the fuse elements is a metal.

17. An integrated circuit comprising:
first and second wiring lines;
third and fourth wiring lines;
a fifth wiring line:
sixth and seventh wiring lines corresponding to the third and fourth wiring lines respectively;
first and second cells corresponding to the third and fourth wiring lines, each of the first and second cells including:
first and second anti-fuse elements corresponding to the first and second wiring lines respectively, each of the first and second anti-fuse elements including a first terminal connected to the corresponding one of the first and second wiring lines, and a second terminal;
a fuse element including a third terminal connected to the second terminal, and a fourth terminal;

an inverter;
a first transistor including a first source, a first drain, and a first gate, the first gate being connected to the corresponding one of the third and fourth wiring lines, one of the first source and the first drain being connected to the fifth wiring line, and the other one of the first source and the first drain being connected to the second terminals and the third terminal; and
a second transistor including a second source, a second drain, and a second gate, the second gate being connected to the corresponding one of the sixth and seventh wiring lines, one of the second source and the second drain being connected to the second terminals and the third terminal, and the other one of the second source and the second drain being connected to an input terminal of the inverter; and
a drive circuit configured to supply first and second potentials to the first terminal of each of the first and second anti-fuse elements via the corresponding one of the first and second wiring lines, the first and second potentials being different from each other.

18. The circuit according to claim 17, wherein the drive circuit includes first and second multiplexers corresponding to the first and second wiring lines respectively, each of the first and second multiplexers including an output terminal connected to each corresponding one of the first and second wiring lines.

19. The circuit according to claim 17, wherein the fourth terminal of each of the fuse elements is connected to a ground power supply.

20. The circuit according to claim 17, wherein:
each of the first and second anti-fuse elements is a third transistor including a third source, a third drain, and a third gate;
when the first terminal of each of the first and second anti-fuse elements is the third gate, the second terminal of each of the first and second anti-fuse elements is at least one of the third source and the third drain; and
when the first terminal of each of the first and second anti-fuse elements is at least one of the third source and the third drain, the second terminal of each of the first and second anti-fuse elements is the third gate.

21. The circuit according to claim 17, wherein each of the first and second anti-fuse elements is a pn junction.

22. The circuit according to claim 17, wherein the fuse element is a metal.

* * * * *